United States Patent [19]

Hansen et al.

[11] Patent Number: 4,802,098

[45] Date of Patent: Jan. 31, 1989

[54] DIGITAL BANDPASS OSCILLOSCOPE

[75] Inventors: Victor L. Hansen, Beaverton; Shiv K. Balakrishnan, Aloha, both of Oreg.

[73] Assignee: Tektronix, Inc., Beaverton, Oreg.

[21] Appl. No.: 34,312

[22] Filed: Apr. 3, 1987

[51] Int. Cl.$^4$ .................. G06F 15/31; G01R 23/16
[52] U.S. Cl. .................. 364/487; 315/367; 324/77 B; 364/483; 364/572
[58] Field of Search ............... 364/483, 487, 572, 481; 324/77 B, 121 R; 315/367, 370

[56] References Cited

U.S. PATENT DOCUMENTS

| | | | |
|---|---|---|---|
| 4,104,725 | 8/1978 | Rose et al. | 364/487 |
| 4,225,940 | 9/1980 | Moriyasu et al. | 315/367 |
| 4,232,263 | 11/1980 | Schwierz | 324/77 B |
| 4,251,754 | 2/1981 | Navarro et al. | 315/367 |
| 4,507,740 | 3/1985 | Star et al. | 364/487 |
| 4,585,975 | 4/1986 | Wimmer | 315/367 |
| 4,654,584 | 3/1987 | Gyles | 364/487 |
| 4,686,457 | 8/1987 | Banno | 324/77 B |
| 4,694,402 | 9/1987 | McEachern et al. | 364/481 |

Primary Examiner—Gary Chin
Assistant Examiner—Kevin J. Teska
Attorney, Agent, or Firm—John P. Dellett; Francis I. Gray

[57] ABSTRACT

A digital bandpass oscilloscope permits an operator to observe both time and frequency domain plots of analog signal components of frequency within a passband of selected center frequency during a time window of selected duration. The input signal is digitized, and the resulting digital data sequence is bandpass filtered and decimated by an adjustable decimation ratio to produce stored waveform data indicating the time dependent behavior of the passband during the time window. The oscilloscope, which utilizes the waveform data to produce both time and frequency domain displays of the passband, adjusts the decimation ratio to ensure that the number of data elements in the waveform data sequence is constant regardless of the selected duration of the time window and adjusts the bandwidth of the passband to minimize aliasing in the time domain display.

35 Claims, 8 Drawing Sheets

DIGITAL BANDPASS OSCILLOSCOPE

BACKGROUND OF THE INVENTION

The present invention relates to digital storage oscilloscopes in general and in particular to a digital oscilloscope for displaying waveforms representing component signals of frequency within selectable passbands of an input signal.

The behavior of component signals of frequency within selected frequency bands of a wideband analog signal is often of interest, and spectrum analyzers provide researchers with frequency domain plots of signal amplitudes within a band. However, sometimes researchers wish to view a frequency band of interest as a time domain plot. Oscilloscopes plot signal magnitudes as functions of time, but when a waveform representing an input signal is displayed by a conventional oscilloscope, signal components having frequencies within a particular frequency band of interest are often difficult to observe due to the presence of higher or lower frequency components. An analog bandpass filter is sometimes utilized to remove the higher and lower frequency components from the analog signal before it is applied to the input of an oscilloscope, but many different bandpass filters would be needed in order to separately view a wide range of selectable passbands.

Moreover, when a conventional digital oscilloscope is utilized for displaying a high frequency band of an input signal, the period of time that can be accurately covered by the display is limited. A digital oscilloscope typically samples an input signal at a multiplicity of discrete points, produces a sequence of digital data representative of these points, and stores the sequence in an acquisition memory. The data is then read out of memory and utilized to control display of a waveform on the oscilloscope's screen. The duration of the "time window" covered by the waveform displayed by a digital oscilloscope may be increased by gathering a larger number of points at the same sampling frequency or by gathering the same number of points at a reduced sampling frequency. Since memory resources are limited, increasing the number of sample points is impractical for combinations of long time windows and high sampling frequencies. While reducing sampling frequency to increase window size is more commonly employed, reducing sampling frequency limits the frequencies of the input signal which can be accurately represented. When a bandpass filtered input signal includes components higher in frequency than half the sampling frequency, the waveform display produced therefrom may substantially misrepresent the behavior of the original analog signal due to an "aliasing" effect, e.g., wherein high frequency components in the input signal cause the waveform display to appear to oscillate at a much lower frequency.

SUMMARY OF THE INVENTION

In accordance with the present invention, a digital oscilloscope displays a waveform representing a selectable frequency band of an analog input signal. The input signal is filtered by an analog low pass filter having a bandwidth sufficient to pass the highest frequency band of interest and the filtered input signal is then sampled. The filter has a stop band including all frequencies higher than twice the sampling rate. The resulting waveform data sequence is applied as input to a quadrature modulator producing data sequences representing real and imaginary components of a complex waveform data sequence. The complex waveform data sequence has a frequency spectrum similar to its input data sequence, but translated in the frequency domain by $-w_c$, where $w_c$ is the center frequency of a selected frequency band. Thus the frequency band in the complex waveform data sequence corresponding to the band of interest is centered about 0 Hz.

The real and imaginary component sequences are filtered by matching multistage low pass, decimating digital filters and a fixed number of elements of an output data sequence produced by the decimating filters are stored in an acquisition memory. The decimation factor of the decimating filters (i.e., the ratio of input sequence elements received to the number of output sequence element produced) is adjusted according to a desired length of the time window of the waveform to be displayed such that the fixed number of data elements stored in the acquisition memory are derived from input signal samples acquired during the full length of the desired time window. In addition, the bandwidths of the low pass decimating digital filters are adjusted so that a waveform display produced according to the data stored in the acquisition memory is not subject to aliasing. As the length of the time window is increased, the bandwidth is reduced and the decimation factor is increased.

To produce a waveform display, the real and imaginary data sequence elements stored in the acquisition memory are sequentially read out and supplied as inputs to matching multistage interpolation filters which increase the number of elements in the real and imaginary data sequences by an interpolation factor (i.e., the ratio of the number of output sequence elements to the number of input sequence elements) equal to the decimation factor of the decimating filters. The interpolated real and imaginary output data sequences are then applied to a quadrature demodulator for generating an output data sequence representing signal components within the frequency band of interest of the analog input signal during the time window. The quadrature demodulator output sequence is utilized to control a waveform display.

The digital oscilloscope of the present invention stores the same amount of waveform data in the acquisition memory regardless of the center frequency of the frequency band of interest and regardless of the length of the time window of the waveform to be displayed. The effects of aliasing are minimized by suitably adjusting the width of the band. A long, high frequency component of an input signal may be represented without aliasing by a relatively smaller amount of stored waveform data than would be required by a conventional digital oscilloscope.

It is accordingly an object of the invention to provide an improved oscilloscope which displays selectable frequency bands of an input signal.

It is another object of the invention to provide an improved digital oscilloscope adapted to minimize aliasing.

It is yet another object of the invention to provide an improved digital storage oscilloscope which converts a long time window of a high frequency signal into a compact sequence of stored digital data from which an accurately representative waveform display may be derived.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
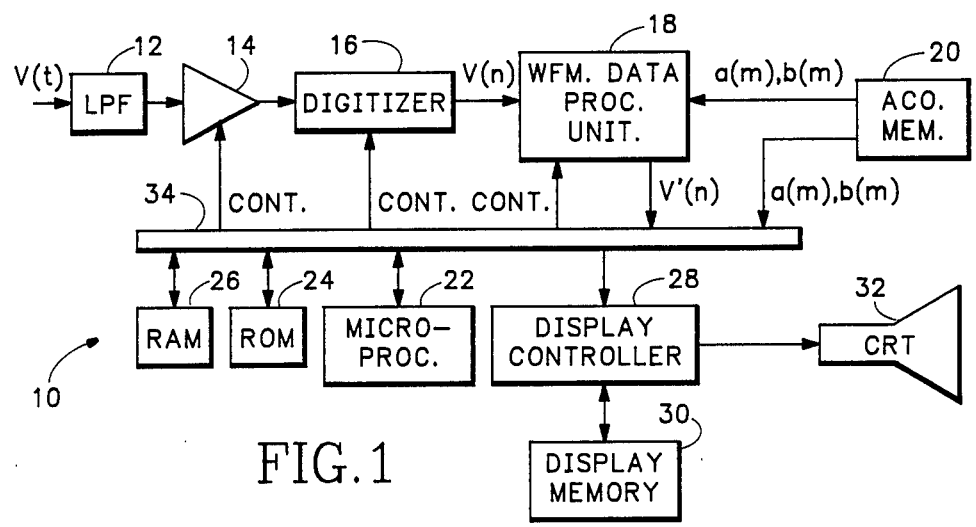
FIG. 1 is a block diagram of a digital storage oscilloscope in accordance with the present invention.

FIG. 1 depicts in block diagram form a digital storage oscilloscope 10 of the present invention adapted to digitize an analog input signal V(t), to store a compact data sequence representation of a selected frequency band of the V(n) signal, and subsequently to produce time and frequency domain displays of the band according to the stored data sequence. Oscilloscope 10 includes a low pass filter 12 for filtering the input signal V(t) and a vertical preamplifier 14 for adjustably offsetting and amplifying the output of filter 12. The output signal produced by preamplifier 14 is sampled at a constant rate by a digitizer 16 which converts the resulting sequence of analog samples to a sequence of digital data V(n). Data sequence V(n) is supplied as input to a waveform data processing unit 18, described in detail hereinbelow, which quadrature modulates, decimates and low pass filters V(n) to produce waveform data sequences a(m) and b(m). Data sequences a(m) and b(m) are corresponding real and imaginary portions of a complex data sequence from which the time dependent behavior of the selected frequency band of the input signal may be determined.

Data sequences a(m) and b(m) are stored in a random access acquisition memory 20. Thereafter, to initiate a time domain display of the band, data sequences a(m) and b(m) are transferred out of acquisition memory 20 and back into waveform data processing unit 18. Data processing unit 18 interpolates and quadrature demodulates a(m) and b(m) to produce an output data sequence V'(n) representing the magnitude of the band as a function of time. Data sequence V'(n) is passed to a microprocessor 22 operating under program control of instructions stored in a read only memory 24 and utilizing a random access memory 26 for temporary data storage. Microprocessor 22 converts data sequence V'(n) to conventional waveform display control data and passes the waveform display control data to a conventional display controller 28. Display controller 28 stores the display control data in a display memory 30 and periodically updates a waveform display on the screen of a cathode ray tube (CRT) 32 according to the data stored in display memory 30.

To initiate a frequency domain display of the selected frequency band, microprocessor 22 reads data sequences a(m) and b(m) from acquisition memory 20 and utilizes a conventional discrete Fourier transform spectrum analysis method to calculate from the a(m) and b(m) sequences a frequency spectrum data sequence representing the magnitude of signals in the band as a function of frequency. Microprocessor 22 converts the computed frequency spectrum data sequence to display control data which is passed to display controller 28, and the display controller produces the frequency domain display on the screen of CRT 32.

Microprocessor 22 communicates with preamplifier 14, digitizer 16, waveform data processing unit 18, acquisition memory 20, ROM 24, RAM 26 and display controller 28 through a bus 34, the bus including data, address and control lines. Microprocessor 22 utilizes bus 34 to control the gain and offset of preamplifier 14 as well as the operating parameters of digitizer 16. Microprocessor 22 also utilizes bus 34 to control handshaking for data transfer between waveform data processing unit 18 and acquisition memory 20, and to control operating parameters of data processing unit 18 as described in detail hereinbelow. Operator input to microprocessor 22 is provided via control knobs and pushbuttons accessing bus 34 through conventional interface circuits (not shown). All hardware blocks shown in FIG. 1, except waveform data processing unit 18, are commonly employed in conventional digital oscilloscopes and are not further detailed herein. Waveform data processing unit 18 is further described hereinbelow.

Figure 2:
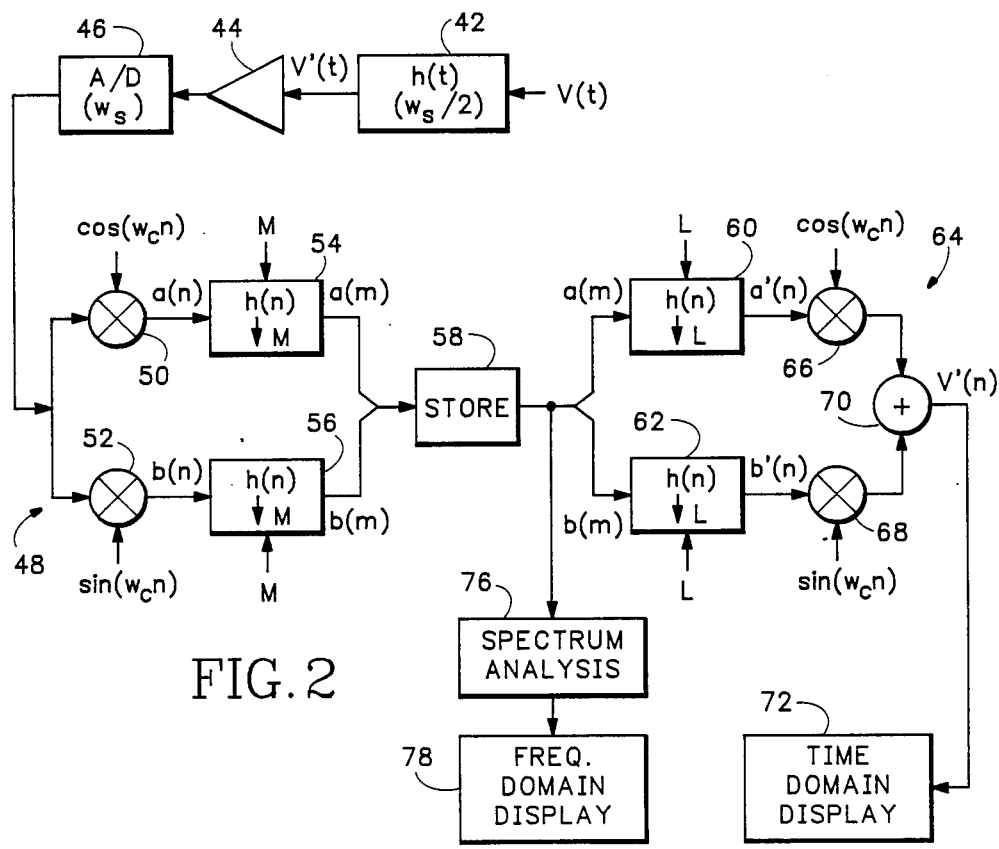
FIG. 2 is a signal flow diagram illustrating waveform data processing by the digital storage oscilloscope of FIG. 1.
Figure 3:
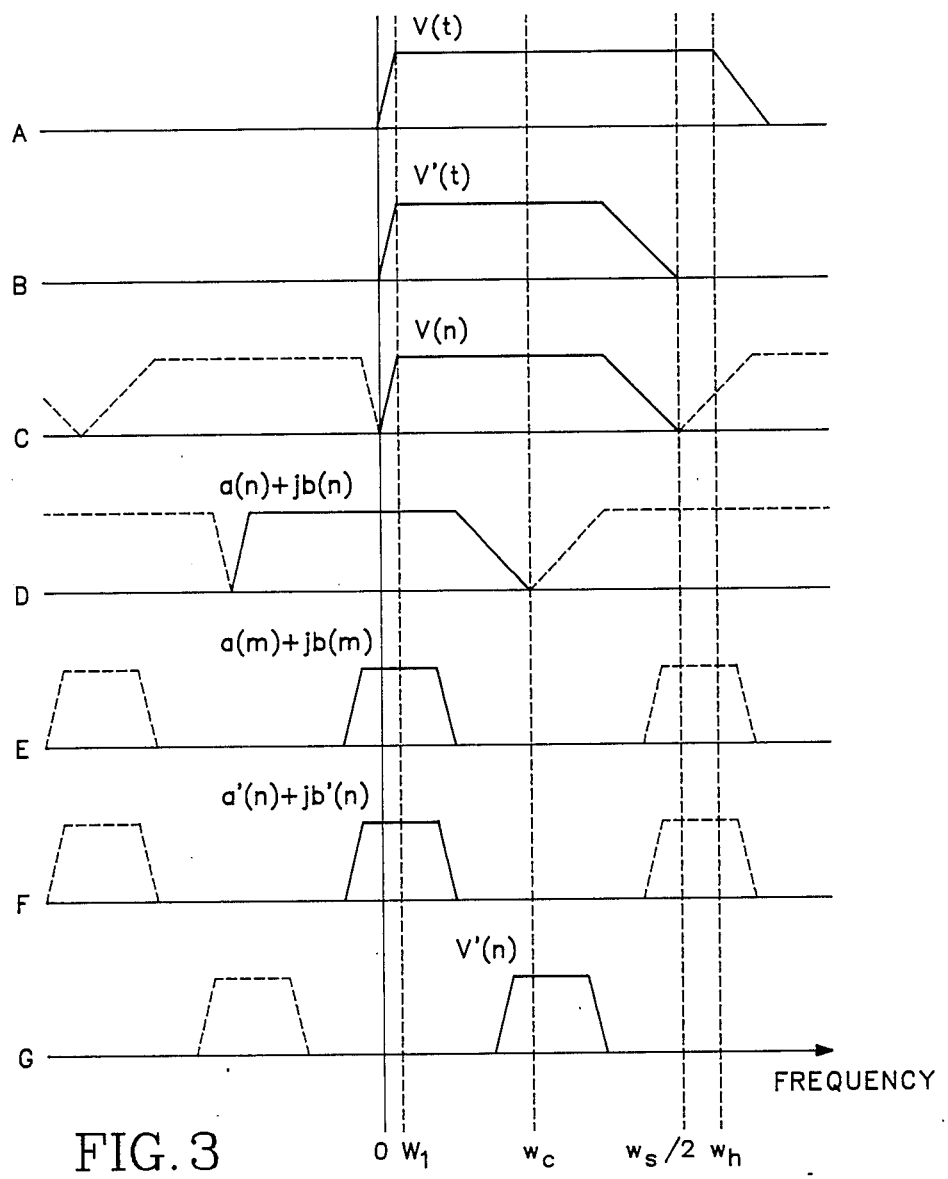
FIG. 3 is a frequency spectrum diagram illustrating signal processing steps carried out by the oscilloscope of FIG. 1.

FIGS. 2 and 3 comprise a signal flow diagram and a sequence of frequency spectrum diagrams which illustrate steps performed by the oscilloscope 10 of FIG. 1 in processing analog input signal V(t) to produce data sequences a(m), b(m) and V'(n). An example of an analog input signal V(t), illustrated in FIG. 3A, has a flat frequency spectrum from a low frequency $w_l$ to a high frequency $w_h$. With reference to FIGS. 1-3, input signal V(t) is initially filtered (step 42) by low pass filter 12 having a stop band starting at $w_s/2$ (where $w_s$ is the sampling rate of digitizer 16) to produce an output signal V'(t) with frequency spectrum as shown in FIG. 3B. After the V'(t) output signal of low pass filter 12 is offset and amplified by preamplifier 16 (step 44), digitizer 16 performs analog-to-digital conversion (step 46) on V'(t) at sampling frequency $w_s$ to provide waveform data sequence V(n). Note that the spectrum of V n) shown in FIG. 3C includes "mirror image" positive and negative frequency bands.

Waveform data processing unit 18 then quadrature modulates input sequence V(n) (step 48) by multiplying V(n) by $\cos(w_c n)$ to form data sequence a(n) (substep 50) and by multiplying V(n) by sin($w_c$n) to provide another data sequence b(n) (substep 52), where $w_c$ is the center frequency of a frequency band of interest in the input signal V(t). FIG. 3D illustrates the frequency spectrum of a complex data sequence a(n) jb(n). Note that the plot of a(n).jb(n) and the positive frequency portion of the plot of V(n) have similar shapes. However, a(n).jb(n) is shifted to the left by $w_c$ such that a band in a(n)+jb(n), corresponding to a frequency band in V(n) centered about frequency $w_c$, is centered about 0 frequency.

Waveform data processing unit 18 low pass filters and decimates sequences a(n) and b(n) (steps 54 and 56, respectively) to supply output sequences a(m) and b(m). The frequency spectrum of a(m)+jb(m) is shown in FIG. 3E. A decimating filter forms an output data sequence having fewer elements than its input data sequence by a factor M, where M is a ratio relating the number of input sequence elements to the number of output sequence elements during a corresponding time period. Both sequences a(m) and b(m) are filtered with a decimation factor M having a value chosen such that a predetermined number (suitably 512) of elements of each sequence a(m) and b(m) represent the time dependent behavior of the passband of interest during a time window of selectable duration. In addition, the bandwidth of the low pass filter which performs filtering steps 54 and 56 is adjusted so that, for the given time window length, a waveform display provided utilizing information contained in sequences a(m) and b(m) would represent a frequency band of interest without aliasing, as discussed in detail hereinbelow.

The 512 element sequences a(m) and b(m) are stored in acquisition memory 20 (step 58). Thereafter, to supply a time domain display of components of the input signal having frequencies within a band centered about $w_c$, waveform data processing unit 18 interpolation filters (steps 60 and 62, respectively) sequences a(m) and b(m) with an interpolation factor L to produce output data sequences a'(n) and b'(n). The frequency spectrum of complex sequence a'(n).jb'(n) is shown in FIG. 3F. The value of L, a ratio relating number of output sequence elements to number of input sequence elements, is chosen to equal the value of M used in steps 54 and 56 whereby sequences a'(n) and b'(n) have the same number of elements as sequences a(n) and b(n).

Waveform data processing unit 18 then demodulates sequences a'(n) and b'(n) (step 64) by multiplying a'(n) by cos($w_c$n) (substep 66), multiplying b'(n) by sin ($w_c$n) (substep 68), and adding the results (step 70) to produce output sequence V'(n) having a frequency spectrum as illustrated in FIG. 3G. Note that V'(n) has a positive frequency band similar in shape to a(m) the central band of FIG. 3F but shifted by $w_c$ as a result of the quadrature modulation whereby the positive band is centered about $w_c$. V'(n) has a negative frequency band which is a mirror image of its positive frequency band. Microprocessor 22 utilizes the waveform data sequence V'(n) to form a time domain display (step 72) representing the time dependent behavior of input signal components having frequencies within the band corresponding to the positive frequency spectrum of V'(n) illustrated in FIG. 3G.

As previously mentioned, the values of decimation factor M and interpolation factor L are equal and chosen according to the selected duration of the time window. In particular, L and M are adjusted in order that the first 512 elements of data sequences a(m) and b(m) are derived from the elements of the V(n) sequence acquired by sampling V(t) during the time window. It can be seen by comparing FIGS. 3C and 3G, that quadrature modulating, low pass filtering, and then quadrature demodulating an input data sequence as described hereinabove, has the effect of bandpass filtering the V(n) data sequence. The passband is centered at $w_c$, the quadrature modulation/demodulation frequency, and the width of the passband is determined by the bandwidth of the low pass filters employed. For a discussion of the process of quadrature modulating, low pass decimation filtering, interpolation filtering and quadrature demodulating a digital data sequence, refer to pages 48-52 of *Multirate Digital Signal Processing* by Lawrence Raniner, published in 1983 by Prentice-Hall, Inc., the latter being incorporated herein by reference.

In the preferred embodiment of the invention, microprocessor 22 performs a spectrum analysis of the selected frequency band (step 76) using a discrete Fourier transform, (suitably a fast Fourier transform) to convert the complex time domain waveform data sequences a(m) and b(m) to a data sequence representing the frequency domain characteristics of the band of interest in input signal V(t). The microprocessor 22 then converts this data sequence into display data transmitted to display controller 28, causing the display controller to produce a display on the screen of CRT 32 similar to the positive frequency portions of FIG. 3G (step 78). The use of a discrete Fourier transform to convert a complex time domain data sequence into a corresponding frequency domain sequence is described on pages 356-384 of *The Fourier Transform and Its Applications* by Ronald N. Bracewell, published 1986 by McGraw-Hill, Inc., incorporated herein by reference. The process of converting data sequences into graphical displays is well known to those skilled in the art and is not further detailed herein.

Figure 4A:
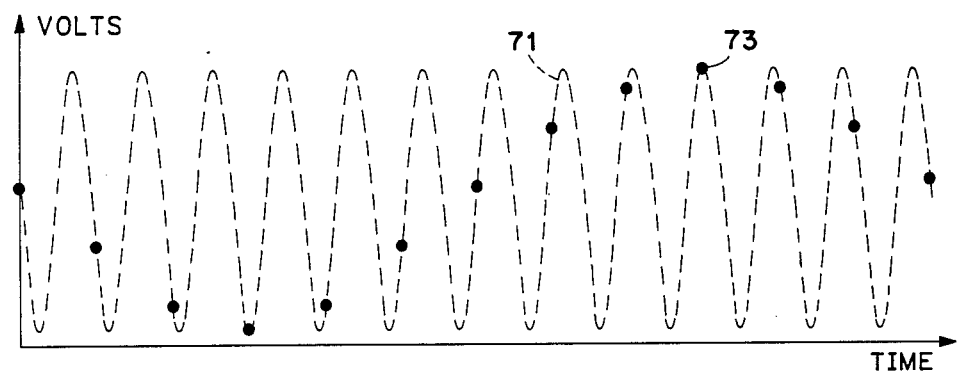
FIGS 4A and 4B are waveform diagrams illustrating aliasing in a conventional oscilloscope.
Figure 4B:
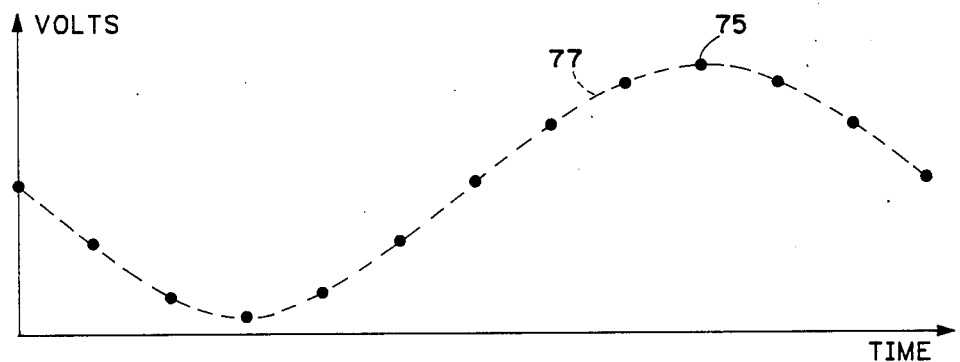

FIG. 4A illustrates a waveform 71 representing a periodic signal sampled at a sampling frequency less than twice the frequency of the waveform, dots 73 representing the samples acquired. When the sample values are digitized and plotted as dots 75 on a digital oscilloscope screen, as shown in FIG. 4B, a viewer tends to view the dots as representing a waveform 77 of lower frequency than the sampled waveform This "aliasing" effect is present when a signal to be displayed is sampled at a frequency less than twice the frequency of the waveform being sampled.

In typical digital oscilloscopes of the prior art, each waveform is displayed from a fixed number of stored sample data points regardless of the sampling frequency. In order to display a longer portion (time window) of an input waveform, the number of waveform samples stored per unit of time must be reduced by reducing the sampling rate. In such case, the maximum frequency of signal which can be displayed without aliasing is reduced.

In the digital oscilloscope of the present invention, the waveform display is provided from a maximum amount of stored data regardless of signal frequency or window length, but the amount of stored data does not limit the length of the waveform time window of the waveform which can be displayed. It simply limits the bandwidth of the passband of interest which is displayed. Thus, for the example signal of FIG. 4A, the sampled waveform data sequence is bandpass filtered so as to exclude frequencies near the frequency of waveform 77 of FIG. 4B but to include frequencies near the frequency of waveform 71 of FIG. 4A. After the bandpass filtered data is stored, the oscilloscope generates additional waveform data by interpolation whereby a display may be produced therefrom which appears like waveform 71 of FIG. 4A rather than like waveform 77 of FIG. 4B. The oscilloscope automatically adjusts the width of the passband to the maximum which will allow signal components therein to be represented without aliasing for a given time window length and center frequency. The oscilloscope may further reduce the width of the pass band in response to operator command.

The oscilloscope may be operated in either "baseband" or "bandpass" modes. In the baseband mode, the operator selects the length of the time window to be displayed and the oscilloscope automatically adjusts the center frequency and bandwidth such that the band to be displayed extends from DC to the highest frequency which can be displayed without aliasing. In the bandpass mode, the operator selects the center frequency and the length of the time window, and the oscilloscope automatically adjusts the bandwidth of the passband to prevent aliasing.

Figure 5A:
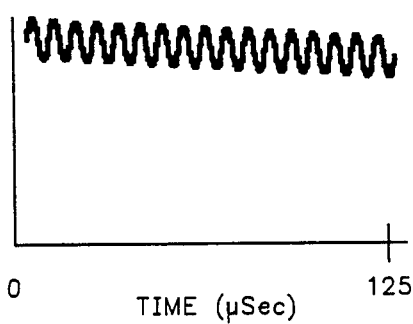
FIGS. 5A-5F show sequences of time and frequency domain displays produced by the oscilloscope of the present invention, operating in a baseband mode, as the time window of the display is increased.
Figure 5B:
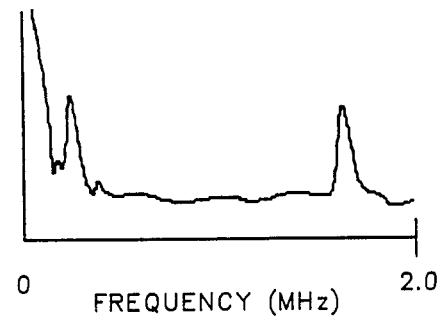

FIGS. 5A-5E illustrate a sequence of time and frequency domain displays provided when the operator selects the baseband mode of operation and then progressively increases the length of the time window to be displayed. In the preferred embodiment of the invention, the analog input signal is band limited to 2 MHz and the system digitizing rate is 4 MHz. FIGS. 5A and 5B show the time and frequency domain displays supplied when the operator has selected a time window of 125 microseconds. The frequency domain display indicates that the signal has three major frequency bands, one near 0 MHz, one near 150 KHz, and one near 1.6 MHz. These three bands are also evident in the time domain display of FIG. 5A. A gentle slope downward is caused by low frequency signal components near 0 Hz, the major sinusoid is contributed by signal components near 150 KHz, and the dense appearance of the 150 KHz signal is due to a 1.6 MHz signal component superimposed thereon.

Figure 5C:
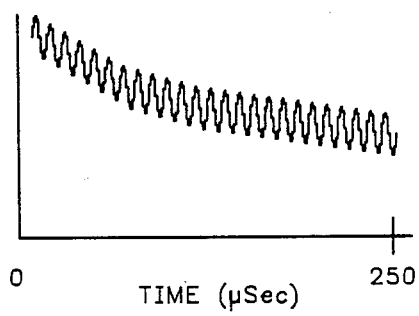
Figure 5D:
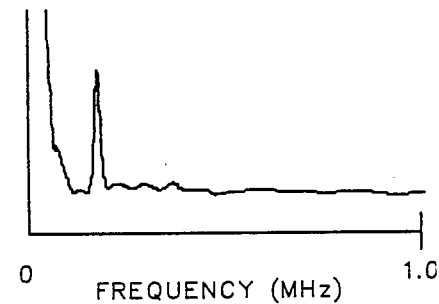

FIGS. 5C and 5D depict the time and frequency domain displays when the operator next selects a time window of 250 microseconds. To prevent aliasing, the oscilloscope automatically reduces the bandwidth of the waveform display data to 1 MHz by adjusting the bandwidth of the low pass filters utilized in steps 54, 56, 60 and 62 of FIG. 2. Programming of filters is as hereinafter more fully described. To account for the longer window length, the oscilloscope automatically halves the number of data points which are stored in memory per unit time by doubling the decimation factor M utilized in steps 54 and 56. (The interpolation factor L utilized in steps 60 and 62 is also doubled to match the new value of M.) Changing the decimation factor is accomplished as hereinafter more fully described. The frequency domain display of FIG. 5D shows that the bandwidth limited waveform data now has only two major frequency bands, near 0 MHz and 150 KHz; the band near 1.6 MHz has been filtered out. The two remaining bands are evident in the time domain display of FIG. 5C. A longer portion of one cycle of the signal component near 0 Hz and more cycles of the major sinusoid contributed by the 150 KHz component are displayed, but the 1.6 MHz component apparent in FIG. 5A has been suppressed.

Figure 5E:
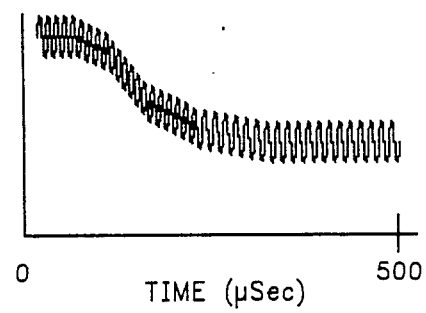
Figure 5F:
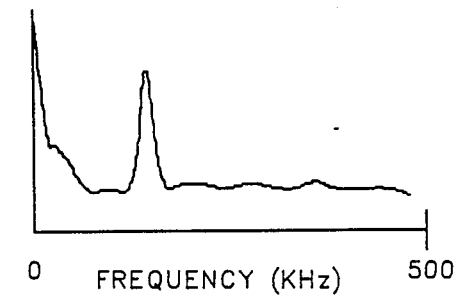

FIGS. 5E and 5F show the time and frequency domain displays formed when the operator selects a time window of 500 microseconds. The oscilloscope again automatically reduces the bandwidth of the waveform display data to 500 Kz by adjusting the bandwidth of the low pass filters utilized in steps 54, 56, 60 and 62 of FIG. 2. The oscilloscope halves the number of data points stored in memory per unit time by doubling the decimation factor M utilized in steps 54 and 56. The interpolation factor L utilized in steps 60 and 62 is also doubled once again. The frequency domain display of FIG. 5F shows that the bandwidth limited signal still has two major frequency bands near 0 MHz and 150 KHz. FIG. 5E illustrates that still more cycles of the signal component near 150 KHz are displayed and a still longer portion of one cycle of the signal near 0 Hz is displayed.

Thus, when the oscilloscope is operating in the baseband mode, it automatically decreases the bandwidth and increases the decimation factor of the digital filters processing the sample data as the operator increases the length of the time window to be displayed such that a waveform display can be provided from the stored data without aliasing.

Figure 6A:
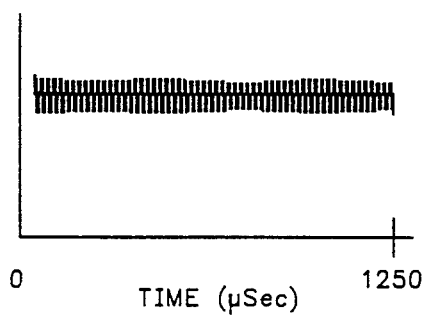
FIGS. 6A-6F show sequences of time and frequency domain displays produced by the oscilloscope of the present invention, operating in a passband mode, as the time window of the display is increased.
Figure 6B:
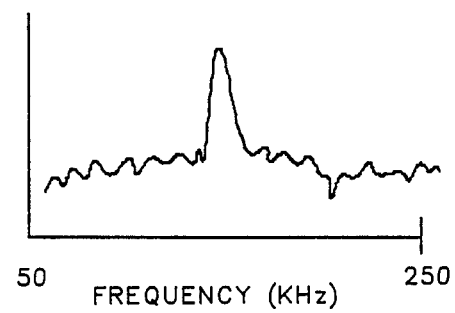

Suppose the operator now selects the passband mode of operation by supplying a center frequency value to microprocessor 22 of FIG. 1. FIGS. 6A-6F indicate the sequence of displays formed in response to the same input signal of the example of FIGS. 5A-5F when the operator selects a center frequency of 150 KHz and continues to increase the length of the time window. FIGS. 6A and 6B show the time and frequency domain displays produced when the operator has selected a time window of 1250 microseconds. The frequency domain display now is in the center of the display and indicates that signal components near 0 Hz and 1.6 MHz have been suppressed. The time domain display of FIG. 6A also shows that the signal bands near 0 Hz and 1.6 MHz have been suppressed and the 150 KHz signal is modulated by another signal. The vertical gain of the oscilloscope has been increased to more clearly show the modulation of the 150 KHz signal.

Figure 6C:
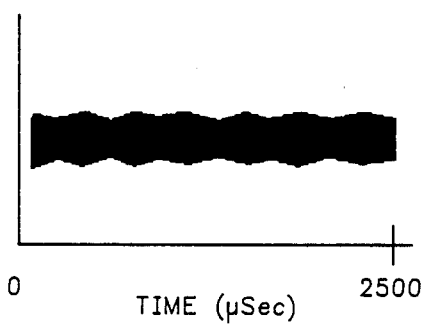
Figure 6D:
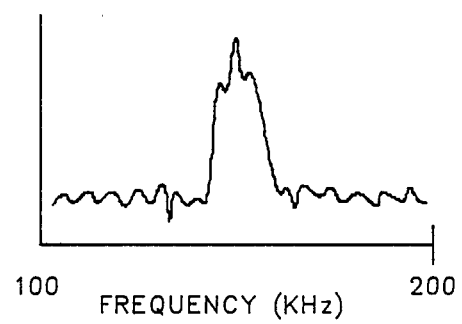
Figure 6E:
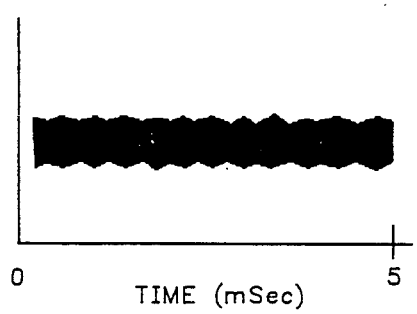
Figure 6F:
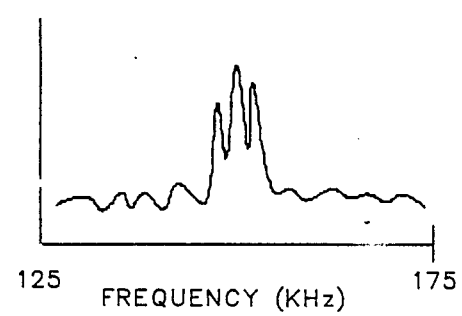

FIGS. 6C and 6D comprise time and frequency domain displays when the operator has selected a time window of 2500 microseconds. The oscilloscope automatically limits the bandwidth to 100 KHz so that the frequency domain display of FIG. 6D now extends from 100 KHz to 200 KHz with the 150 KHz band still centered in the display. The peak at 150 KHz is split to reveal the signal as a modulated carrier. The time domain display of FIG. 6C shows more cycles of the carrier. FIGS. 6E and 6F illustrate the time and frequency domain displays when the operator has selected a time window of 5 milliseconds. The oscilloscope automatically limits the bandwidth to 50 KHz whereby the frequency domain display of FIG. 6F extends from 125 KHz to 175 KHz. Note the split in the peak at 150 KHz has become more pronounced and the time domain display of FIG. 6C reveals still more cycles of the carrier.

Thus by adjustably bandpass filtering the digital sample data, the length of the time window may be increased without subjecting the waveform display to aliasing. Moreover, since the presence of high frequency signal components obscures observation of low frequency signal components and viceversa, the ability to bandpass filter the waveform data sequence enhances the operator's ability to study signals because it enables the operator to separately view the time dependent behavior of various passbands.

Figure 7:
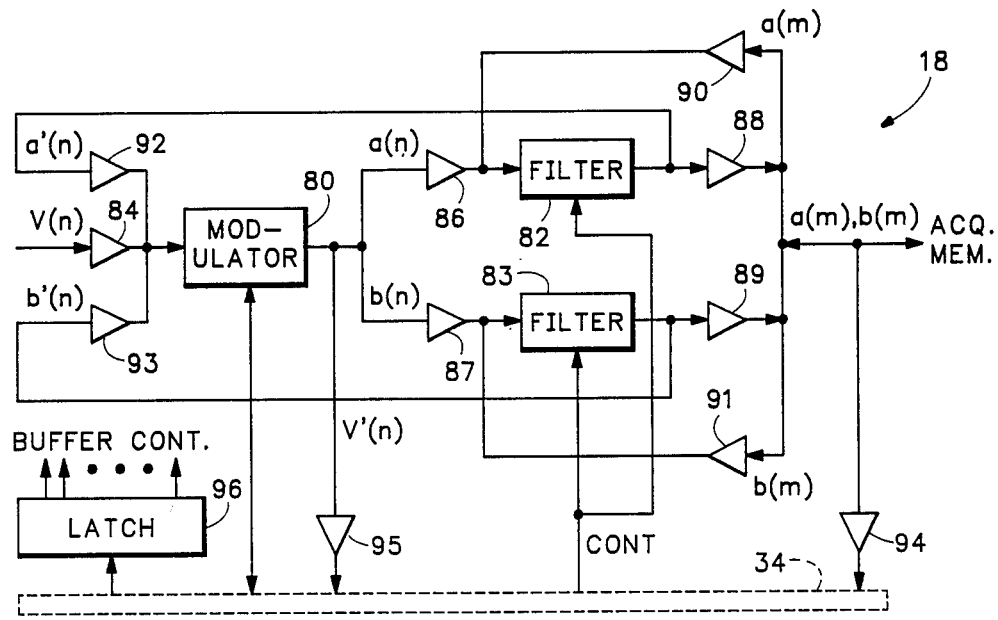
FIG. 7 is a block diagram of the waveform data processing unit of FIG. 1.

Referring to FIG. 7, depicting waveform data processing unit 18 of FIG. 1 in block diagram form, quadrature modulation and demodulation (steps 48 and 64 of FIG. 2) are performed by a modulator 80, and decimation and interpolation filtering (steps 54, 56, 60 and 62 of FIG. 2) are performed by multistage digital filters 82 and 83. The waveform data sequence V(n) supplied by digitizer 16 of FIG. 1 is supplied as input to modulator 80 through a tristate buffer 84, and modulator 80 produces therefrom the complex waveform data sequences a(n) and b(n) in an alternating fashion. The a(n) data sequence is provided through a tristate buffer 86 to an input of multistage filter 82 and the b(n) data sequence is supplied to an input of a similar multistage filter 83 through a tristate buffer 87. Multistage filters 82 and 83 low pass filter sequences a(n) and b(n) to form the corresponding lowpass filtered, decimated sequences a(m) and b(m) transmitted for storage to acquisition memory 20 of FIG. 1 through tristate buffers 88 and 89 respectively. To produce a frequency domain display, the microprocessor 22 of FIG. 1 accesses a(m) and b(m) sequences stored in acquisition memory 20 through bus 34 which is connected to acquisition memory by a tristate buffer 94.

When the a(m) and b(m) data sequences stored in acquisition memory 20 are to be interpolated and demodulated prior to forming a time domain display, corresponding elements of these sequences are alternately transmitted to the inputs of multistage filters 82 and 83 via tristate buffers 90 and 91, respectively. Multistage filters 82 and 83 then interpolate these data sequences to simultaneously supply corresponding elements of sequences a'(n) and b'(n), respectively, which elements are alternately passed to the input of modulator 80 through tristate buffers 92 and 93. Modulator 80 quadrature demodulates sequences a'(n) and b'(n) supplying the output waveform data sequence V'(n) which is transmitted to microprocessor 22 of FIG. 1 via bus 34 through a tristate buffer 95 connecting the output of modulator 80 to bus 34. The states of tristate buffers 84-95 are controlled by data provided by microprocessor 22 on bus 34, the data being latched onto control terminals of buffers 84-95 through a latch 96. Microcomputer 22 also controls operation of modulator 80 and multistage filters 82 and 83 through data and control signals transmitted via bus 34.

Figure 8:
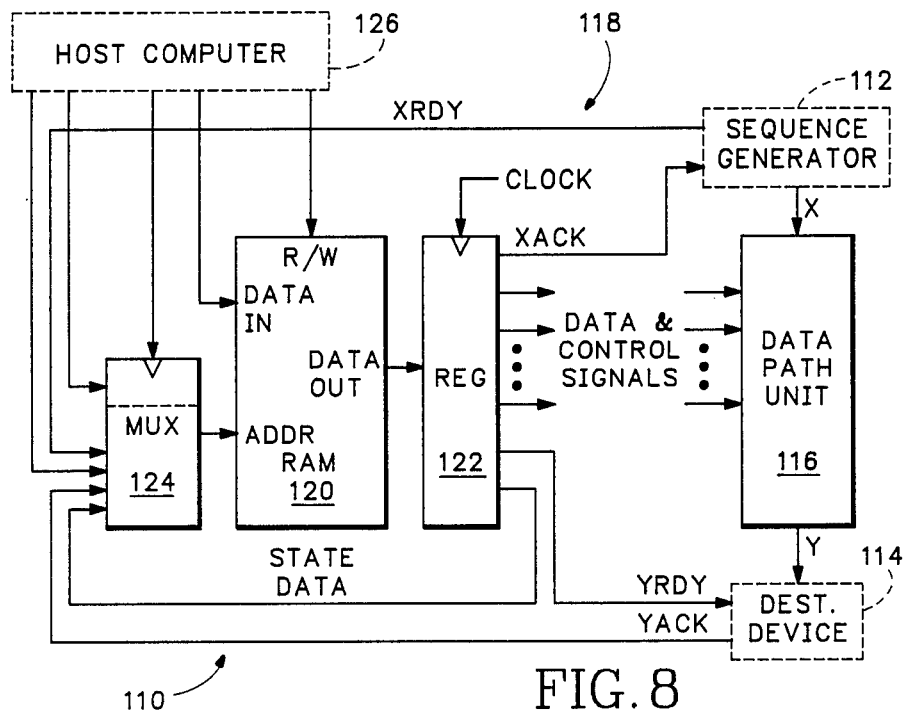
FIG. 8 is a block diagram of a multistage programmable digital filter of FIG. 7.

With reference to FIG. 8, a multistage digital filter circuit 110 suitable for use as filter 82 or 83 of the waveform data processing unit 18 of FIG. 7 is depicted in block diagram form. Filter circuit 110 is adapted to convert an input data sequence X from a sequence generator 112 (such as for example modulator 80 of FIG. 7) into an output data sequence Y according to a programmably determined transfer function, and to pass the output data sequence to a destination device 114 (such as for example acquisition memory 20 of FIG. 1).

Filter circuit 110 comprises a data path unit 116 adapted to calculate each element Y(i) of the output data sequence Y according to the values of one or more elements X(0) through X(i) of the input data sequence X. Filter circuit 110 also comprises a state machine 118 for controlling the operation of data path unit 116 by transmitting sequences of data and control signals to data path unit 116 and for controlling input/output handshaking between data path unit 116, sequence generator 112 and destination device 114.

The basic function of state machine 118, generation of predetermined patterns of data and control signals in response to patterns of data input, may be implemented in a variety of wellknown ways. As shown in FIG. 8 state machine 118 suitably comprises a random access memory (RAM) 120 and a register 122 clocked by an externally generated clock signal. RAM 120 normally operates in a read mode, and addressed data stored in RAM 120 supplies input to register 122. The output of register 122 supplies data and control signals to data path unit 116, an acknowledge signal (XACK) to sequence generator 112, and a ready signal (YRDY) to destination device 114. Register 122 also stores and feeds back state data to addressing terminals of RAM 120 via a multiplexer 124. A data ready signal (XRDY) supplied by sequence generator 112 and a data acknowledge signal from destination device 114 are connected to additional addressing inputs of RAM 120 via multiplexer 124.

In order to reprogram the operation of digital filter 110, data stored in RAM 120 may be altered by a host computer 126 (such as microprocessor 22 of FIG. 1) which has access to data input terminals of RAM 120 and also to the address terminals of RAM 120 by way of multiplexer 124. Host computer 126 controls the switching state of multiplexer 124 and a read/write control terminal of RAM 120. Host computer 126 may reset state machine 110 to an initial state by means of a RESET signal supplied to the address terminals of RAM 120 via multiplexer 124, and may inhibit state changes in state machine 110 with a HALT signal, also supplied to address terminals of RAM 120 via multiplexer 124.

In the preferred embodiment, filter circuit 110 has from 1 to 8 digital filter stages. Each filter stage is a finite-duration impulse response filter producing an output data sequence w in response to an input data sequence v, and the stages are cascaded so that the output sequence w produced by one stage becomes the input sequence v to the next stage. Each stage may have a different transfer function whereby the "ith" output sequence element w(i) is a sum of terms, each term comprising the product of a selected input sequence elements v(0) through v(i) and a selected coefficient h(n). For example, the transfer function for a linear direct FIR filter stage may be of the form:

$$w(i) = \sum_{n=0}^{N-1} h(n)*v(i-n) \quad [2]$$

As can be ascertained from equation [2], one output sequence element w(i) is produced for each input sequence element v(i) and element w(N) of the w sequence, and each subsequent element w(i), comprises the sum of N product terms (i.e., the filter stage is of "length" N). Transfer functions of forms other than shown in equation [2] are also possible, as discussed hereinbelow.

For a stage of length N=3, having a transfer function according to equation [2], it can be seen from equation [2] that the first five elements w(i) of the output sequence w are as shown in Table I below:

TABLE I w(0) = h(0)*v(0)
w(1) = h(1)*v(0) + h(0)*v(1)
w(2) = h(2)*v(0) + h(1)*v(1) + h(0)*v(2)
w(3) = h(2)*v(1) + h(1)*v(2) + h(0)*v(3)

TABLE I-continued w(4) = h(2)*v(2) + h(1)*v(3) + h(0)*v(4)

Table I illustrates that each element v(i) of the input sequence v forms three products, H(0)*v(i), h(1)*v(i), and h(2)*v(i), and that each successive product is included as a term in a sum associated with a separate, successive element w(i) of the output sequence y.

Figure 9:
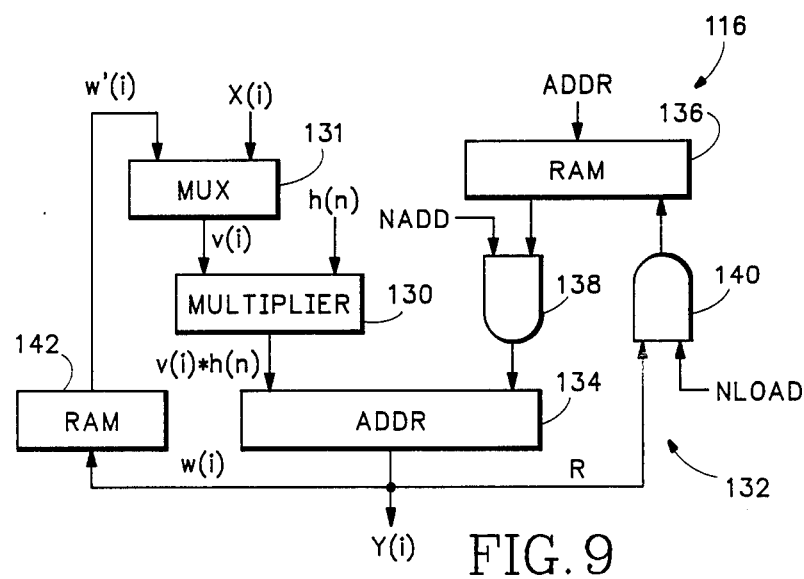
FIG. 9 is a simplified block diagram of the data path unit of FIG. 8.

Referring to FIG. 9, depicting data path unit 116 of FIG. 8 in simplified block diagram form, data path unit 116 includes a multiplier 130 for producing each term h(n)*v(i−n) for each element of the output sequence w of each filter stage, and an accumulator 132 for accumulating (summing) terms produced by the multiplier to produce output sequence elements w(i). Thus, to produce the direct FIR filter output sequence illustrated in Table I, data path unit 116 multiplies each incoming sequence element v(i) by three coefficients H(0), h(1), and h(2) and adds each resulting product to a separate accumulated partial sum R(i), R(i+1) and R(i+2), each sum being associated with a separate output sequence element w(i), w(i+1) and w(i+2). When all terms associated with a particular output sequence element w(i) for a particular stage have been accumulated, the resulting accumulated value is provided as the next filter stage output element w(i).

For each stage, the next input sequence element to be multiplied by multiplier 130 is selected by a multiplexer 131. If multiplier 130 is to generate a term for the first stage of a cascaded filter, then multiplexer 131 selects X(i), the current element of the input sequence for the cascade. If multiplier 130 is to generate a term for a filter stage other than the first cascaded stage, then multiplexer 131 selects w'(i), the last output sequence element produced by the preceding filter stage. The appropriate coefficient h(n) input to multiplier 130 is supplied by state machine 118 of FIG. 8.

Accumulator 132 includes an adder 134 and a random access memory (RAM) 136. Adder 134 is adapted to add each output term produced by multiplier 130 to an accumulated sum R stored in RAM 136. The sum produced by adder 134 may then be stored in RAM 136, thereby replacing the accumulated sum R with the result of the addition. Addressing of RAM 136 is controlled by an address signal (ADDR) provided by state machine 118 of FIG. 8. Data output terminals of RAM 136 are coupled to an input of adder 134 through a set of AND gates 138, each having another input controlled by a signal NADD supplied by state machine 118 of FIG. 8 When NADD is low, a 0 value, rather than the currently addressed data in RAM 136, is passed to adder 134. The NADD signal may be driven low when the output of multiplier 130 is the first term of a sum to be accumulated in RAM 136 so that adder 134 merely adds a 0 to that term and forwards it for storage in RAM 136. The output of adder 134 is coupled to data input terminals of RAM 136 through another set of AND gates 140. A signal NLOAD produced by state machine 118 is applied to an additional input of each AND gate 140 and is driven low when RAM 136 is to store a 0 value rather than the output of adder 134. The NLOAD signal allows the contents of any storage location in RAM 136 to be initialized to 0 when necessary.

In implementing a direct full band FIR filter stage having a transfer function according to equation [2], a total of N−1 storage locations for the stage are reserved in RAM 136 to allow for accumulation of N−1 terms. For example when N is 3, two storage locations in RAM 136 are provided to store partially accumulated sums R(i) and R(i+1) for the next two terms, w(i) and w(i+1) of the output sequence. When v(i) is initially applied to one input of multiplier 130, the state machine 118 supplies coefficient H(0) to the other input of multiplier 130, and the multiplier supplies the term h(0)*v(i). Adder 134 then sums this term with the partially accumulated sum R(i) for w(i) stored in RAM 136 and provides the result as the next element w(i) of the filter stage. The value of w(i) is not stored in RAM 136. Instead, the NLOAD signal applied to AND gate 140 is driven low, and the accumulated sum R(i) in the RAM 136 storage location holding associated with w(i) is initialized to 0 and subsequently utilized for accumulating the partial sum R(i+N−1) associated with output sequence element w(i.N−1).

State machine 118 next supplies coefficient h(1) to multiplier 130 so that the multiplier forms the term h(1)*v(i). Adder 134 adds this term to the accumulated sum for element w(i+1) stored in RAM 136. The resulting partial sum R(i+1), which does not yet include all of the terms comprising element w(i+1), is then stored in RAM 136 to update the last accumulated value of R(i+1).

Next, state machine 118 supplies coefficient h(2) to the multiplier 130 which produces one more term h(2)*v(i), the first term of stage output sequence element w(i+2). The NADD signal applied to AND gates 138 is driven low such that adder 134 sums this term with 0. The resulting output of adder 134 is stored as partial sum R(i+2) at the RAM 136 address which previously contained the accumulated partial sum R(i) for the current stage output element w(i). At this point, multiplexer 131 may supply a new input sequence element v(i+1) as input to multiplier 130, and the process of multiplying three coefficients H(0), h(1) and h(2) by the input sequence element and accumulating three product terms is repeated.

Thus, each time an input sequence element v(i) to a particular stage is selected by multiplexer 131, a total of N product terms are formed by multiplier 130, one of which is added to an accumulated partial sum R(i) to provide an output sequence element w(i) and the remaining N−1 terms are accumulated into partial sums R(i+1) through R(i+N−1) associated with output sequence elements w(i+1) through w(i+N−1), the partial sums being stored in RAM 136.

When adder 134 adds the last term to an accumulated sum R(i) to produce the resulting output sequence element w(i) of a particular stage, and when the stage happens to be the last stage of the cascaded filter, w(i) is transmitted out of data path unit 116 as the next element Y(i) of the output sequence Y. However, when the current w(i) output of adder 134 is an element of an output sequence w of a stage other than the last stage, w(i) is stored in another RAM 142. RAM 142 includes one storage location for holding the most recently generated output sequence element w(i) for each intermediate stage other than the last stage.

Inasmuch as the filter stages are cascaded, the output element w(i) of one stage becomes the input element of the next. Accordingly, the output element w(i) stored in RAM 142 for each intermediate stage may be provided as the next element w'(i) of the w'sequence input to multiplexer 131, and multiplexer 131 may select that element as the next element v(i) of the stage and supply it to multiplier 130.

Thus the "feedback" path between the output of adder 134 and the input to multiplier 130 provided by RAM 142 and multiplexer 131 allows data path unit 116 to carry out the functions of several filter stages on a "time sharing" basis. For example, multiplier 130 and accumulator 132 may process an input sequence element for a first stage by selecting an element v(i) of sequence v as the input to multiplier 130, and then process an input sequence element for a second stage by selecting an element w'(i) of sequence w' as input to multiplier 30, followed by processing a next input sequence element v(i+1) for the first stage by supplying that element to multiplier 130.

State machine 118 controls data flow through data path unit 116 such that the data processing unit gives priority to stage calculations in reverse order, the last stage having highest priority and the first stage having lowest priority. Therefore, when an input sequence element for the last cascaded stage is available in RAM 142, that element is provided as the next input to multiplier 130. Conversely, a data processing unit input sequence element X(i) is applied to the input of multiplier 130 only when RAM 142 is empty. Thus, calculations for a latter stage always have priority over calculations for a preceding stage.

Figure 10:
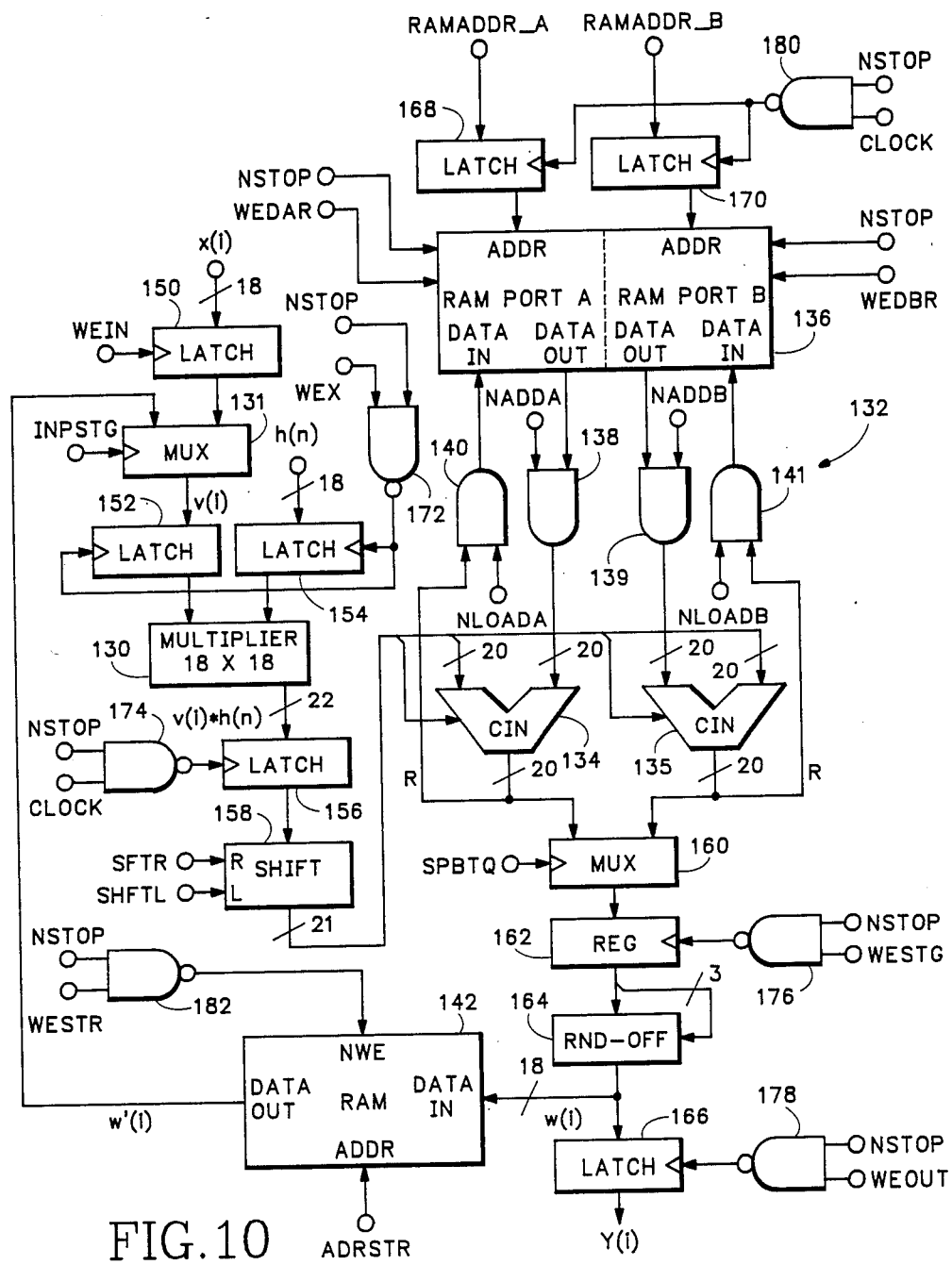
FIG. 10 is a more detailed block diagram of the data path unit of FIG. 8.

A more detailed block diagram of data path unit 116, in FIG. 10, illustrates additional features of the unit. As discussed more fully hereinbelow, operating speed of data path unit 116 is improved by "pipelining" the data through multiplexer 131, multiplier 130, adder 134, and RAM 142 utilizing latches and registers to clock data through each processing stage whereby the stages can operate concurrently. A shift register 158 is provided to selectively increment or decrement output terms from multiplier 130 by a factor of two, or to pass the term unchanged, thereby permitting selective scaling of such terms. The speed with which accumulator 132 carries out accumulation operations for certain types of filter stages (as described in more detail below) is improved by providing RAM 136 as a dual port random access memory and by providing an additional adder 135 to assist adder 134 in performing accumulation operations. Provisions are also included for temporarily halting flow of data through the data path unit 116 when necessary.

With further reference to FIG. 10, 18-bit data path unit input sequence elements X(i) are latched by a latch 150 onto the input of multiplexer 131, and the output of multiplexer 131 and 18-bit coefficients h(n) are latched onto inputs of multiplier 130 by latches 152 and 154, respectively. The 22-bit output of multiplier 130 is applied to the input of shift register 158 through a latch 156, and the 20 most significant bits of the 21-bit output of shift register 158 provide an input to adder 134 as well as to adder 135. A multiplexer 160 multiplexes the 20-bit outputs of adders 134 and 135 onto the input of a register 162, and the 18 most significant bits of the contents of register 162 are supplied as input to a round-off logic circuit 164. The 18-bit output of round-off logic circuit 164 is input to a latch 166 and to data input terminals of RAM 142.

The output of ADDER 134 and a signal NLOADA are connected as inputs to a set of 20 AND gates 140, while the outputs of AND gates 140 are connected to data input terminals of port A of dual port RAM 136. Data output terminals of port A of RAM 136, along with a signal NADDA, provide inputs to a set of 20 AND gates 138, the outputs of which drive an input of adder 134. Similarly, the output of adder 135 and a signal NLOADB are connected as inputs to a set of 20 AND gates 141 while the outputs of AND gates 141 are coupled to data input terminals of port B of dual port RAM 136. Data output terminals of port B, along with a signal NADDB, control inputs of a set of 20 AND gates 139, the outputs of which are input to adder 135. When write are enabled by the output of a NAND gate 180 driven by a system clock signal at its input, a pair of latches 168 and 170 latch addressing signals RAMADDRA and RAMADDRB produced by state machine 118 of FIG. 8 onto addressing terminals of ports A and B, respectively, of dual port RAM 136. Signals WEDAR and WEDBR, supplied by state machine 118, control whether ports A and B, respectively, are read or write enabled.

In carrying out filter stage operations according to the direct FIR filter transfer function of equation [2], when state machine 118 of FIG. 8 receives an XRDY signal from sequence generator 112, indicating that an 18-bit element X(i) of input sequence X is available at the input of latch 150, state machine 118 may transmit an enabling signal WEIN to latch 150 causing latch 150 to forward X(i) to multiplexer 131. When state machine 118 subsequently determines that X(i) is to be processed, it transmits a signal INPSTG to multiplexer 131 causing the multiplexer to forward X(i) to latch 152. At the same time state machine 118 places an 18-bit coefficient h(0) on the input to latch 154. When state machine 118 determines that multiplier 130 has completed its last multiplication operation, the state machine transmits an enable signal WEX to a NAND gate 172 causing the NAND gate output to enable latches 152 and 154, thereby passing X(i) and h(0) to inputs of multiplier 130. Multiplier 130 then computes h(0)*v(i) and passes it to latch 156. Latch 156, input enabled by a system clock signal acting through a NAND gate 174, passes the 22-bit output of multiplier 130 to shift register 158.

State machine 118 supplies a pair of control signal inputs SHFL and SHFR to shift register 158. When only SHFL is asserted, the shift register multiplies its input by 2 and passes the 21 most significant bits of the result to adders 134 and 135. When only SHFR is asserted, shift register 158 divides its input by two. If neither SHFL and SHFR are asserted, the shift register passes its input to adders 134 and 135 unchanged. Although shift register 158 has a 21-bit output, only the most significant 20 bits are applied as inputs of adders 134 and 135. The remaining least significant bit is applied to a carry in (CIN) input of each adder to cause rounding of the multiplier output.

The additional adder 135 is provided to carry out accumulations concurrently with adder 134 for filter stages which are implemented with "symmetric" coefficients h(n), such as linear phase FIR filter stages in which for all h(n), h(n)=h(N−1−n). For example when N=7, h(0)=h(6), h(1)=h(5), and h(2)=h(4). When coefficients are symmetric, a term h(n)*v(i) produced by multiplier 130 has the same value as the term h(N−1−n)*v(i). Therefore adder 135, which has independent access to dual port RAM 136, may carry out an accumulation for the h(N−1−n)*v(i) term using the value of h(n)*v(i) at the same time that adder 134 carries out the accumulation for the h(n)*v(i) term. This substantially doubles the rate at which data path unit 116 can process an input sequence element to a symmetric coefficient filter stage.

When adder 134 or 135 produces a fully accumulated sum R(i) associated with an output sequence element w(i), state machine 118 transmits a signal SPBTQ to multiplexer 160 to couple the output of the adder 134 or 135 to the input of register 162. State machine 118 subsequently transmits an enabling signal WESTG to a NAND gate 176, and the output of NAND gate 176 enables register 162. The 18 most significant bits stored in register 162 are passed to input terminals of round-off circuit 164 while the least significant bit (LSB2), the next least significant bit (LSB1), and the most significant bit (MSB) of the data stored in register 162 are applied to control terminals of circuit 164. Circuit 164 increments its 18 bit input data shown in the following truth table:

TABLE II

| Increment | MSB | LSB1 | LSB2 |
|---|---|---|---|
| NO | 0 | 0 | 0 |
| NO | 0 | 0 | 1 |
| YES | 0 | 1 | 0 |
| YES | 0 | 1 | 1 |
| NO | 1 | 0 | 0 |
| NO | 1 | 0 | 1 |
| NO | 1 | 1 | 0 |
| YES | 1 | 1 | 1 |

When the 18-bit output of round-off circuit 164 is an element Y(i) of the output sequence of the data path unit, state machine 118 transmits an enable signal WEOUT to an input of a NAND gate 178. The output of NAND gate 178 causes latch 166 to latch Y(i) onto output terminals of the data path unit 116. With reference to FIG. 8, state machine 118 then transmits the YRDY signal to destination device 114, and when device 114 accepts Y(i), it acknowledges reception by asserting the YACK signal.

If the output w(i) of round-off circuit 164 is an element in the output sequence of an intermediate filter stage other than the last cascaded stage, state machine 118 addresses RAM 142 with the address of a storage location associated with such intermediate stage utilizing an address signal ADRSTR. State machine 118 then transmits a WESTR signal to a NAND gate 182 the output of which write enables RAM 142 so that RAM 142 stores w(i). When state machine 118 subsequently determines that the stored w(i) value is to be next processed as an input signal to the next filter stage, according to the previously discussed order of priority, it transmits the appropriate address ADRSTR signal to RAM 142 whereby the value of w(i) is stored therein.

NAND gates 172, 174, 176, 178, 180 and 182 each have a signal NSTOP supplied by state machine 118 as an additional input, and when NSTOP is driven low, latches 152, 154, 156, 166, and 170, register 162, and RAM 142 cannot be write enabled. An NSTOP signal is also applied to enabling inputs of ports A and B of RAM 136, and when NSTOP is asserted, the RAM cannot be addressed or accessed. Thus when NSTOP is asserted the data processing operation of data path unit 116 is halted. State machine 118 drives NSTOP low when the data processing pipeline within data processing unit 116 is full and destination device 114 is currently unable to accept another output sequence element Y(i).

There has been described a multistage programmable digital filter circuit wherein each stage provides an output sequence w in response to an input sequence v according to equation [2] hereinabove. It should be understood, however, that the data path unit may implement digital filter stages having transfer functions other than as expressed in equation [2] inasmuch as the particular pattern of control signals that state machine 118 produces may be altered by altering data stored in RAM 120.

For example, a decimation filter is one in which the number of terms in its output sequence is fewer than the number of terms in its input sequence. The transfer function of one such decimation filter relating elements w(i) of its output data sequence to elements v(i) of its input data sequence is characterized by the equation:

$$w(i) = \sum_{n=0}^{N} h(n)*v(Mi + C - n) \quad [3]$$

where N is the length of the filter, h(n) is a selected coefficient, M is a decimation factor, and C is a sequence selection constant. For a stage of length N=3, with M=2 and C=0, having a transfer function according to equation [3], it can be seen from equation [3] that the first five elements w(i) of the output sequence w are as shown in Table III below:

TABLE III

| |
|---|
| w(0) = h(0)*v(0) |
| w(1) = h(0)*v(2) + h(1)*v(1) + h(2)*v(0) |
| w(2) = h(0)*v(4) + h(1)*v(3) + h(2)*v(2) |
| w(3) = h(0)*v(6) + h(1)*v(5) + h(2)*v(4) |
| w(4) = h(0)*v(8) + h(1)*v(7) + h(2)*v(6) |

Referring to FIG. 10, when a filter stage has a transfer function according to equation [3], state machine 118 of FIG. 8 sets the INPSTG signal to apply v(0) to the input of latch 152, places h(0) on the input of latch 154, and then asserts the WEX signal, thereby latching h(0) and v(0) to the inputs of multiplier 130. The output of multiplier 130 is then latched by latch 156 and passed through shift register 158 to adder 134. With NADDA driven low, adder 134 adds h(0)*v(0) to 0 and the result is provided as output sequence element w(0). State machine 118 applies h(2) to the input of latch 154 and asserts the WEX signal thereby latching h(2) and v(0) to the inputs of multiplier 130. The output of multiplier 130 is passed through latch 156 and shift register 158 to adder 134. With NADDA again driven low, adder 134 adds h(2)*v(0) to 0 and the resulting partial sum R(1) is stored in RAM 136.

When v(1) is next available at the input to multiplexer 131, state machine 118 of FIG. 8 sets the INPSTG signal to apply v(1) to the input of latch 152 and places h(1) on the input of latch 154, and then asserts the WEX signal thereby latching h(1) and v(1) to the inputs of multiplier 130. The output of multiplier 130 is passed through latch 156 and shift register 158 to adder 134. With NADDA driven high, adder 134 adds h(1)*v(1) to the accumulated sum R(1) to produce the result h(1)*v(1)+h(2)*v(0) which is stored in RAM 136 to update the last stored of R(1).

When v(2) is available at the input to multiplexer 131, state machine 118 of FIG. 8 sets the INPSTG signal to apply v(2) to the input of latch 152, places h(0) on the input of latch 154, and asserts the WEX signal to latch coefficient h(0) and sequence element v(2) to the inputs of multiplier 130. The output of multiplier 130 is transmitted through latch 156 and shift register 158 to adder 134. With NADDA driven high, adder 134 adds h(0)*v(2) to the accumulated sum R(1) to produce the result h(2)*v(2)+h(1)*v(1) h(2)*v(0) which is provided as stage output sequence element w(1) through multiplexer 160, register 162, and round-off circuit 164.

State machine 118 then places h(2) at the input to latch 154 and asserts the WEX signal in order to latch h(2) and v(2) to the inputs of multiplier 130. When the output of multiplier 130 is subsequently passed to adder 134, NADDA is driven low so that adder 134 adds h(2)*v(2) to 0. The resulting partial sum R(2) is stored in RAM 136.

Similar multiplication and accumulation procedures are performed for each subsequent element v(i) of the stage input sequence such that when i is an even integer, it is multiplied by h(0) and by h(2) to produce terms which are accumulated to form two successive partial sums R(i) and R(i+1), and such that when i is an odd integer, it is multiplied by h(1) to produce a term which is accumulated in only one partial sum R(i). Thus, filter circuit 110 may also include stages which act as decimation filters, each providing an output data sequence having fewer elements than its input data sequence, and wherein the transfer function relating output and input sequences is programmably determined.

The filter circuit 110 may include stages acting as interpolation filters wherein the number of terms in its output sequence is greater than the number of terms in its input sequence. The transfer function of one such interpolation filter, which doubles the number of elements in an input sequence to produce an output sequence, is characterized by the equations:

$$w(2*i) = \sum_{n=0}^{Lim1} h(2*n)*v(i-n) \quad [4]$$

$$w(2*i + 1) = \sum_{n=0}^{Lim2} h(2*n + 1)*v(i-n) \quad [5]$$

where $Lim1 = (N-1)/2$ and $Lim2 = (N-1)/2 - 1$ when N is odd, and where $Lim1 = (N-2)/2$ and $Lim2 = (N-2)/2$ when N is even.

For a stage of length $N=5$, having a transfer function according to equations [4] and [5], it can be seen that the first eight terms w(i) of the output sequence w are as shown in Table IV below:

TABLE IV

| |
|---|
| w(0) = h(0)*v(0) |
| w(1) = h(1)*v(0) |
| w(2) = h(0)*v(1) + h(2)*v(0) |
| w(3) = h(1)*v(1) + h(3)*v(0) |
| w(4) = h(0)*v(2) + h(2)*v(1) + h(4)*v(0) |
| w(5) = h(1)*v(2) + h(3)*v(1) |
| w(6) = h(0)*v(3) + h(2)*v(2) + h(4)*v(1) |
| w(7) = h(1)*v(4) + h(3)*v(2) |

Referring to FIG. 10, when a filter stage has a transfer function according to equations [4] and [5], state machine 118 of FIG. 8 sets the INPSTG signal to apply v(0) to the input of latch 152, places h(0) on the input of latch 154, and then asserts the WEX signal thereby latching h(0) and v(0) to the inputs of multiplier 130. The output of multiplier 130 is passed by latch 156 and shift register 158 to adder 134. With NADDA driven low, adder 134 adds h(0)*v(0) to 0 and the result is produced as output sequence element w(0) State machine 118 applies h(1) to the input of latch 154 and asserts the WEX signal so as to latch h(1) and v(0) to the inputs of multiplier 130. The output of multiplier 130 is passed to adder 134, and with NADDA again driven low, adder 134 adds h(1)*v(0) to 0. The result is passed by multiplexer 160 to register 162 to provide output sequence element w(1).

State machine 118 then applies h(2) to the input of latch 154 and asserts the WEX signal to latch h(2) and v(0) to the inputs of multiplier 30. The output of multiplier 130 is passed to adder 134. With NADDA still low, adder 134 adds h(2)*v(0) to 0 and the resulting partial sum R(2) is stored in RAM 136. State machine 118 next applies h(3) to the input of latch 154 and asserts the WEX signal to latch h(3) and v(0) to the inputs of multiplier 130. With NADDA still low, adder 134 subsequently adds the product h(3)*v(0) to 0 and the resulting partial sum R(3) is stored in RAM 136. Finally, state machine 118 applies h(4) to the input of latch 154 and asserts the WEX signal to latch h(4) and v(0) to the inputs of multiplier 130. With NADDA still low, adder 134 subsequently adds product h(4)*v(0) to 0 to produce partial sum R(4) which is all stored in RAM 136.

Thereafter, when input sequence element v(1) is available at an input to multiplexer 131, state machine 118 sets the INPSTG signal to apply v(1) to the input of latch 152. The state machine causes data multiplier 130 to sequentially produce terms h(0)*v(1). h(1)*v(1), h(2)*v(1), h(3)*v(1), h(4).v(1), and causes accumulator 132 to accumulate these terms into sums R(2) through R(6) respectively, and in the process thereof, causes the accumulator to produce output sequence elements w(2) and w(3). Subsequent input sequence elements v(i) are processed in a similar fashion such that two output sequence elements w(2*i) and w(2*i.1) are generated for each input sequence element.

Therefore it can be seen that the filter circuit 110 is adapted to implement cascaded digital filters, some of which may be decimation or interpolation filters, wherein each stage filters its input data sequence to produce an output data sequence according to a programmably determined transfer function, and wherein the transfer function of each stage may be independently determined. Filter circuit 110 is therefore adapted to implement steps 54 56, 60 and 62 (see FIG. 2) of the waveform data processing procedure performed by the oscilloscope of the present invention.

Figure 11:
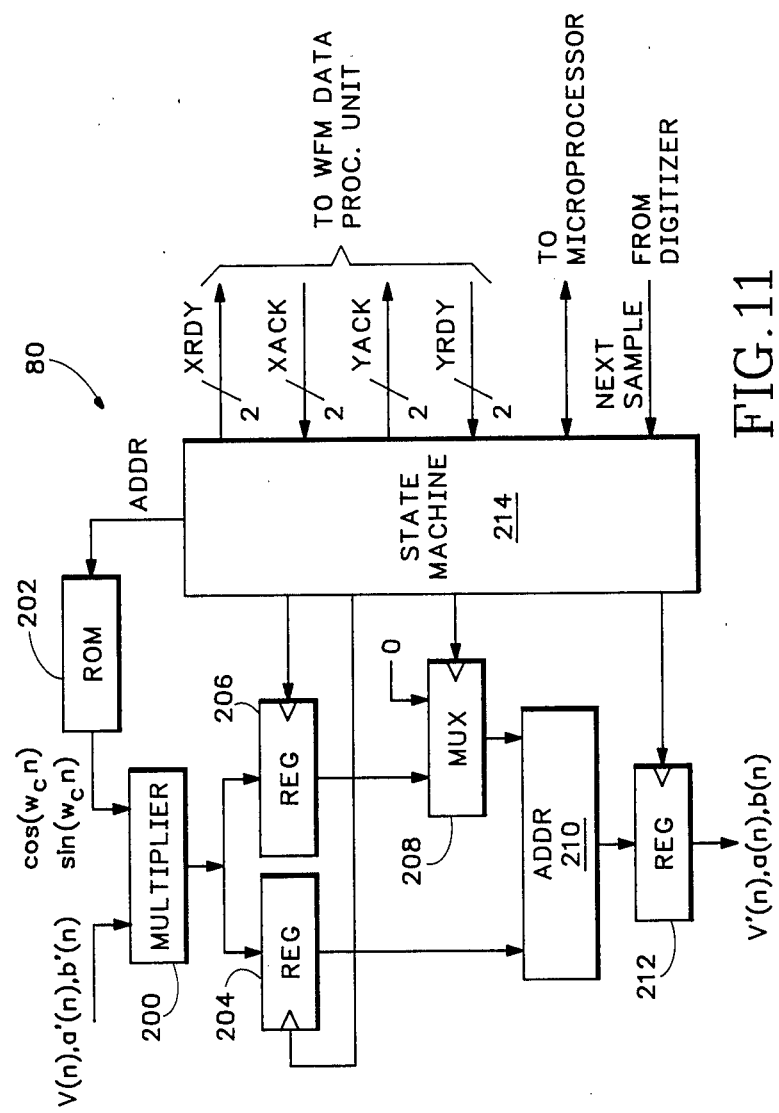
FIG. 11 is a block diagram of the modulator circuit of FIG. 7.

The quadrature demodulation step 64 of FIG. 2 is performed by modulator 80 of FIG. 7. A suitable modulator 80, shown in block diagram form in FIG. 11, includes a multiplier 200 for multiplying an element of input data sequence a'(n) by $\cos(w_c n)$, produced by a read only memory (ROM) 202, and then multiplying a corresponding element of data sequence b'(n) by $\sin(w_c n)$ also produced by ROM 202. The output product $a'(n)*\cos(w_c n)$ of multiplier 200 is stored in a register 204 and the output product $b'(n)*\sin(w_c n)$ is stored in a register 206. The content of register 204 is applied directly to an input of an adder 210 and the content of register 206 is applied indirectly to another input of adder 210 through a multiplexer 208. Adder 210 combines the contents of registers 204 and 206 to provide V'(n) which is stored in a register 212 for subsequent transmission to microprocessor 22 of FIG. 1.

ROM 202 stores sequences of data representing sine and cosine functions such that as its address is progressively incremented in steps of constant size, ROM 202 produces the desired sine and cosine functions in an interleaved manner, the size of the addressing steps determining the value of $w_c$. A programmed state machine 214 sequentially addresses ROM 202 in step sizes determined by programming data from microprocessor 22. State machine 214 controls operation of registers 204, 206, and 212 and multiplexer 208, signals microcomputer 22 when data is ready in register 212, transmits a YACK signal to filter 82 or 83 of FIG. 7 to indicate when modulator 80 has accepted another a'(n) or b'(n) element, and monitors YRDY signals from filters 82 and 83 determined when a next input element a'(n) or b'(n) is available.

Modulator 80 performs the quadrature modulation step 48 of FIG. 2. On detection of a NEXT SAMPLE signal from digitizer 16, indicating that it has produced a next element data sequence V(n), multiplier 200 multiplies V(n) by cos(w$_c$n) and stores the result in register 204. State machine 214 switches multiplexer 208 to pass an input 0 value to adder 210 instead of the contents of register 206. Adder 210 therefore provides a(n)=V(n)-*cos(w$_c$) which is stored in register 212. State machine 214 transmits an XRDY signal to filter 82 of FIG. 7 when an element a(n) is available in register 212. When filter 82 begins processing a(n), it returns an XACK signal to state machine 214.

After a(n) is stored in register 204, multiplier 200 multiplies V(n) by sin(w$_c$n) to provide b(n), and after state machine 214 receives the XACK signal from filter 82, it transfers b(n) into register 212 by way of adder 210 and transmits another XACK signal to filter 83 of FIG. 7. When filter 83 begins processing b(n) it returns an XACK signal to state machine 214. Thereafter, the modulator may begin processing the next element of sequence V(n) when available at the input of multiplier 200.

There has been described a digital oscilloscope which permits an operator to observe both time and frequency domain behavior of analog signal components having frequencies within a band about a selected center frequency during a time window of selected duration. The input signal is digitized, and the resulting digital data sequence is modulated, lowpass filtered and decimated by an adjustable decimation ratio to produce stored waveform data indicating the time dependent behavior of the frequency band during the time window. The oscilloscope, which interpolates and demodulates the stored waveform data to produce a time domain display of the signal components, adjusts the decimation ratio to ensure that the amount of stored waveform data is constant regardless of the selected duration of the time window. The oscilloscope adjusts the bandwidth of the passband to minimize aliasing in the time domain display.

While preferred embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A digital oscilloscope for displaying a representation of frequency components of an analog signal during a time window, the time window having an adjustable duration, the oscilloscope comprising:
   digitizing means responsive to said analog signal for generating a first data sequence representative of said analog signal during said time window;
   filter means responsive to said first data sequence for bandpass filtering and first data sequence to produce a second data sequence; and
   display means for displaying said representation according to said second data sequence.

2. The digital oscilloscope in accordance with claim 1 wherein said filter means has an adjustable bandwidth, said digital oscilloscope further comprising means for adjusting said bandwidth according to the duration of said time window.

3. The digital oscilloscope in accordance with claim 1 wherein said digitizing means comprises:
   a low pass filter for filtering said analog signal to produce an output signal; and
   means for periodically sampling said output signal at a constant sampling frequency to produce a sequence of voltage levels, and for generating said first data sequence according to said sequence of voltage levels.

4. The digital oscilloscope in accordance with claim 3 wherein said low pass filter has a bandwidth not greater than one half said sampling frequency.

5. A digital oscilloscope for displaying a representation of frequency components of an analog signal during a time window, the time window having an adjustable duration, the oscilloscope comprising:
   digitizing means responsive to said analog signal for generating a first data sequence representative of said analog signal during said time window;
   filter means responsive to said first data sequence for bandpass filtering and first data sequence according to an adjustable center frequency and an adjustable bandwidth to produce a second data sequence; and
   means for displaying said representation according to said second data sequence.

6. The digital oscilloscope in accordance with claim 5 further comprising:
   means for adjusting said center frequency; and
   means for adjusting said bandwidth according to the duration of said time window and the adjusted center frequency.

7. A digital oscilloscope for displaying a representation of frequency components of an analog signal, the oscilloscope comprising:
   digitizing means responsive to said analog signal for generating a first data sequence representative of said analog signal during a time window of adjustable duration; and
   data processing means for quadrature modulating, lowpass filtering and decimating said first data sequence to produce waveform data, and for interpolating and quadrature demodulating said waveform data to produce a second data sequence representative of components of said analog signal included within a passband of adjustable center frequency and adjustable bandwidth.

8. The digital oscilloscope in accordance with claim 7 further comprising memory means for storing said waveform display data.

9. The digital oscilloscope in accordance with claim 7 further comprising means for displaying a time domain representation of said analog signal components according to said second data sequence.

10. The digital oscilloscope in accordance with claim 7 further comprising means for displaying a frequency domain representation of said analog signal components according to said waveform data, and for displaying a time domain representation of said analog signal components according to said second data sequence.

11. The digital oscilloscope in accordance with claim 7 wherein said data processing means comprises a filter for low pass filtering said first data sequence with an adjustable bandwidth, said bandwidth being adjusted according to the duration of said time window.

12. The digital oscilloscope in accordance with claim 7 wherein said data processing means decimates said first data sequence according to an adjustable decimation ratio.

13. The digital oscilloscope in accordance with claim 12 wherein said decimation ratio is adjusted according to the duration of said time window.

14. The digital oscilloscope in accordance with claim 7 wherein said data processing means decimates said first data sequence according to an adjustable decimation ratio and interpolates said waveform data according to an adjustable interpolation ratio.

15. The digital oscilloscope in accordance with claim 14 wherein said decimation and interpolation ratios are adjusted according to the duration of said time window.

16. A digital oscilloscope for displaying a representation of frequency components of an analog signal, the oscilloscope comprising:
digitizing means responsive to said analog signal for generating a first data sequence representative of said analog signal during a time window of adjustable duration;
data processing means for quadrature modulating, lowpass filtering and decimating said first data sequence to produce waveform data, and for interpolating and quadrature demodulating said waveform data to produce a second data sequence representative of components of said analog signal included within a frequency band of adjustable center frequency and adjustable bandwidth;
means for storing said waveform display data; and
means for displaying a time domain representation of said analog signal components according to said second data sequence.

17. The digital oscilloscope in accordance with claim 16 further comprising means for displaying a frequency domain representation of said analog signal components according to said waveform data.

18. The digital oscilloscope in accordance with claim 16 wherein said data processing means low pass filters and decimates said first data sequence with an adjustable bandwidth and according to an adjustable decimation ratio and interpolates said waveform data according to an adjustable interpolation ratio, said bandwidth, decimation ratio and interpolation ratio being adjusted according to the duration of said time window such that said time domain representation is substantially free of aliasing and such that said waveform data sequence includes a constant number of elements irrespective of the duration of said time window.

19. A method for displaying a representation of frequency component os an analog signal during a time window, the time window having an adjustable duration, the method comprising the steps of:
digitizing said analog signal to produce a first data sequence representative of said analog signal during said time window;
bandpass filtering said first data sequence according to an adjustable bandwidth to produce a second data sequence; and
displaying said representation according to said second data sequence.

20. The method in accordance with claim 19 further comprising the step of adjusting said bandwidth according to the duration of said time window.

21. The method in accordance with claim 19 wherein the step of digitizing said analog signal comprises the substeps of:
low pass filtering said analog signal to produce an output signal;
periodically sampling said output signal at a constant sampling frequency to produce a sequence of voltage levels; and
producing said first data sequence according to said sequence of voltage levels.

22. The method in accordance with claim 21 wherein said analog input signal is low pass filtered with a bandwidth not greater than one half said sampling frequency.

23. A method for displaying a representation of time dependent behavior of frequency components of an analog signal during a time window, the time window having an adjustable duration, the method comprising the steps of:
generating a first data sequence representative of said analog signal during said time window;
bandpass filtering said first data sequence according to an adjustable center frequency and an adjustable bandwidth to produce a second data sequence; and
displaying said representation according to said second data sequence.

24. The method in accordance with claim 23 further comprising the step of adjusting said bandwidth according to the duration of said time window and according to said center frequency.

25. A method for displaying a representation of frequency components of an analog signal, the method comprising the steps of:
generating a first data sequence representative of said analog signal during a time window of adjustable duration;
quadrature modulating said first data sequence to produce second and third data sequences;
lowpass filtering and decimating said second and third data sequences to produce fourth and fifth data sequences;
interpolating said fourth and fifth data sequences to produce sixth and seventh data sequences; and
quadrature demodulating said sixth and seventh data sequences to produce an eighth data sequence representative of components of said analog signal included within a frequency band of adjustable center frequency and adjustable bandwidth.

26. The method in accordance with claim 25 further comprising the step of storing said fourth and fifth data sequences in memory means.

27. The method in accordance with claim 25 further comprising the step of displaying a time domain representation of said analog signal components according to said eighth data sequence.

28. The method in accordance with claim 25 further comprising the steps of:
displaying a frequency domain representation of said analog signal components according to said fourth and fifth data sequences, and
displaying a time domain representation of said analog signal components according to said eights data sequence.

29. The method in accordance with claim 25 wherein said second and third data sequences are decimated according to an adjustable decimation ratio and said fourth and fifth data sequences are interpolated according to an adjustable interpolation ratio, said decimation and interpolation ratios being adjusted accorded to the duration of said time window.

30. The method in accordance with claim 25 wherein said second and third data sequences are lowpass filtered by a filter having an adjustable bandwidth, said bandwidth being adjusted according the duration of said time window.

31. The method in accordance with claim 25 wherein said second and third data sequences are decimated according to an adjustable decimation ratio.

32. The method in accordance with claim 31 further comprising the step of adjusting said decimation ratio according to the duration of said time window.

33. A method for displaying a representation of frequency components of an analog signal, the method comprising the steps of:
  generating a first data sequence representative of said analog signal during a time window of adjustable duration;
  quadrature modulating said first data sequence to produce second and third data sequences;
  lowpass filtering and decimating said second and third data sequences to produce fourth and fifth data sequences;
  storing said fourth and fifth data sequences in memory means;
  interpolating said fourth and fifth data sequences to produce sixth and seventh data sequences;
  quadrature demodulating said sixth and seventh data sequences to produce an eighth data sequence representative of components of said analog signal included within a frequency band of adjustable center frequency and adjustable bandwidth; and
  displaying a time domain representation of said analog signal components according to said eighth data sequence.

34. The method in accordance with claim 33 further comprising the step of displaying a frequency domain representation of said analog signal components according to said fourth and fifth data sequences.

35. The method in accordance with claim 33 wherein said second and third data sequences are decimated according to an adjustable decimation ratio and said fourth and fifth data sequences are interpolated according to an adjustable interpolation ratio, said decimation and interpolation ratios being adjusted according to the duration of said time window, and wherein said second and third data sequences are lowpass filtered by a filter having an adjustable bandwidth, said bandwidth being adjusted according the duration of said time window.

* * * * *

UNITED STATES PATENT AND TRADEMARK OFFICE
CERTIFICATE OF CORRECTION

PATENT NO. : 4,802,098

DATED : January 31, 1989

INVENTOR(S) : Victor L. Hansen, Shiv K. Balakrishnan

It is certified that error appears in the above-identified patent and that said Letters Patent is hereby corrected as shown below:

Column 19, line 67, "and" should be --said--

Column 20, line 28, "and" should be --said--

Signed and Sealed this

Twenty-seventh Day of April, 1993

Attest:

MICHAEL K. KIRK

Attesting Officer

Acting Commissioner of Patents and Trademarks